United States Patent [19]

Kosuge

[11] Patent Number: 5,736,845
[45] Date of Patent: Apr. 7, 1998

[54] SPECTRUM ANALYZER HAVING IMAGE FREQUENCY ELIMINATING DEVICE

[75] Inventor: Takashi Kosuge, Kumagaya, Japan

[73] Assignee: Advantest Corp., Tokyo, Japan

[21] Appl. No.: 555,759

[22] Filed: Nov. 9, 1995

[30] Foreign Application Priority Data

Nov. 11, 1994 [JP] Japan .................. 6-303197

[51] Int. Cl.$^6$ .................................................. G01R 13/24
[52] U.S. Cl. ..................... 324/76.27; 324/76.23
[58] Field of Search .................. 324/76.27, 76.19, 324/76.22; 372/32; 375/97

[56] References Cited

U.S. PATENT DOCUMENTS

| | | | |
|---|---|---|---|
| 3,729,738 | 4/1973 | Cross et al. | 324/5 |
| 4,451,782 | 5/1984 | Ashida | 324/77 |
| 4,680,778 | 7/1987 | Krinock | 375/97 |
| 4,817,101 | 3/1989 | Wyeth et al. | 372/32 |
| 4,975,633 | 12/1990 | Toda | 324/77 |

*Primary Examiner*—Ernest F. Karlsen
*Assistant Examiner*—Thomas Valone
*Attorney, Agent, or Firm*—Muramatsu & Associates

[57] ABSTRACT

A frequency spectrum analyzer includes a display for showing frequency spectrums in a frequency domain versus power level form, a local oscillator which is driven by a sweep signal to repeatedly cause a frequency sweep of a local signal wherein the local oscillator and the display operate in synchronism with the sweep signal, an intermediate frequency filter whose center frequency is an intermediate frequency for transmitting intermediate frequency signals, a frequency mixer for mixing an input signal to be measured and the local signal and generating the intermediate frequency signals whose frequency is a difference of the input signal and fundamental and harmonic components of the local signal, a detector for rectifying the intermediate frequency signal from the intermediate frequency filter wherein an output of the detector shows frequency spectrums of a true frequency spectrum of the input signal and image spectrums produced by the mixer, a sweep offset control for alternately causing a frequency shift in the frequency sweep in the local signal wherein the frequency shift is equal to $f_{if2} \times 2/N$, where $f_{if2}$ is the intermediate frequency and N is a harmonic number of the local signal, and an image removal processor for monitoring the output of the detector and identifying the true frequency spectrum of the input signal and the image spectrums on the basis of positional changes between the frequency sweep without the frequency shift and the frequency sweep involving the frequency shift in the local signal.

10 Claims, 5 Drawing Sheets

SPECTRUM ANALYZER HAVING IMAGE FREQUENCY ELIMINATING DEVICE

BACKGROUND OF THE INVENTION

This invention relates to a spectrum analyzer which analyzes frequency spectrum of an input signal, and more particularly, to a frequency spectrum analyzer using fundamental or harmonic frequencies of a local oscillator for frequency spectrum analysis which is capable of identifying true frequency spectrums of the input signal and unwanted image spectrums produced by the spectrum analyzer and eliminating such image spectrums.

Figure 3:
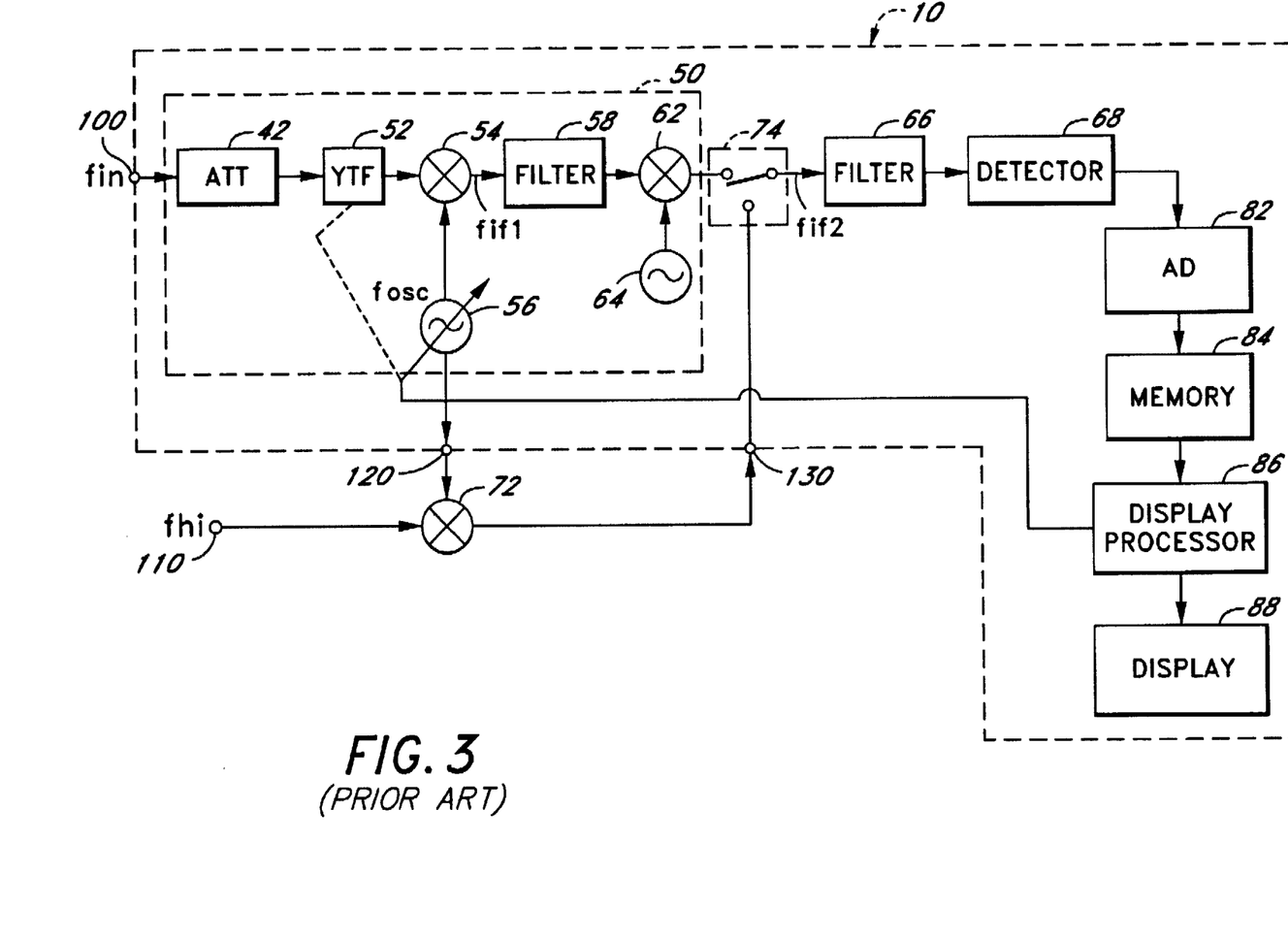
FIG. 3 is a block diagram showing a configuration of a conventional spectrum analyzer when using an external mixer.

An example of a structure in a conventional microwave band spectrum analyzer is shown in FIG. 3. A spectrum analyzer 10 has a frequency converter 50, a second intermediate frequency filter 66, a switch 74, a detector 68, an AD convertor 82, an AD buffer memory 84, display processor 86 and a display 88. The frequency converter 50 includes an attenuator 42, an YIG tuned filter (YTF) 52, a first mixer 54, a first local oscillator 56 which is a sweep oscillator, a first intermediate frequency filter 58, a second mixer 62 and a second local oscillator 64.

This structure of the spectrum analyzer 10 covers input frequencies of, for example, 0–26 GHz. For an input signal whose frequency is higher than 26 GHz, as shown in FIG. 3, an external mixer 72 which has a higher frequency capability is connected to the spectrum analyzer 10. The external mixer 72 is provided with the first local signal from the first local oscillator 56 through a local output terminal 120. An input signal is provided to the external mixer 72 wherein it is mixed with harmonics of the first local signal to produce second intermediate frequency signals which have differences between the input signal frequency and the harmonics of the first local frequency.

The second intermediate frequency signals are supplied to the second intermediate frequency filter 66 through an input terminal 130 and the switch 74. The second intermediate frequency filter 66 is a band pass filter a center frequency of which determines the second intermediate frequency in the mixers 62 and 72.

In operation, an input signal $f_{in}$ from an input terminal 100 is reduced its power level by the attenuator 42 and provided to the first mixer 54 through the YTF 52. The first local oscillator 56 sweeps its frequency, for example, from 4 GHz to 8 GHz, based on a sweep signal such as a sawtooth signal. The local oscillator 56 is an YIG (yttrium-iron-garnet) tuned oscillator which linearly changes its frequency in proportion to a magnetic intensity produced by the sweep signal. The sweep signal is supplied, for example, from the display processor 86 which also controls the display 88 in synchronism with the first local oscillator 56. The first local signal from the oscillator 56 is mixed with the input signal at the first mixer 54.

The YTF 52 is a band pass filter using an YIG (yttrium-iron-garnet) in which a resonant frequency is linearly varied by a magnetic field produced by an electric current, in this example, the sweep signal. The first mixer 54 mixes the input signal through the YTF 52 and the first local signal and produces a first intermediate frequency signal $f_{if1}$ the frequency of which is, for example, 4.231 GHz. The first intermediate frequency signal $f_{if1}$ is provided to the second mixer 62 through the first intermediate frequency filter 58. The YTF 52 and the first local oscillator 56 are controlled at the same time by the sweep signal (sawtooth signal) to linearly change their resonant frequencies. More specifically, the resonant frequency of the YTF 52 is linearly varied by the sweep signal to be equal to the sum of the first local frequency $f_{osc}$ and the first intermediate frequency $f_{if1}$.

The second mixer 62 mixes the first intermediate frequency signal $f_{if1}$ with a local signal from the second local oscillator 64 and produces a second intermediate frequency signal $f_{if2}$ which is determined by the second intermediate frequency filter 66. In this example, the second local oscillator 64 is a fixed frequency local oscillator whose frequency is 3.81 GHz and thus the second intermediate frequency in this case is 421 MHz. The second intermediate frequency signal $f_{if2}$ is provided to the second intermediate frequency filter 66 through the switch 74.

The second intermediate frequency filter 66 is a band pass filter whose bandwidth is changed by a control signal, which determines a resolution of the spectrum analysis in the spectrum analyzer 10. The second intermediate frequency signal from the filter 66 is provided to the detector 68 where it is rectified to produce an envelope waveform which is typically a passing band shape of the second intermediate frequency filter 66. The AD converter 82 converts the detected signal from the detector 68 to a digital signal which is stored in the AD buffer memory 84.

The display processor 86 reads the digital data from the AD buffer memory 84 to provide an arithmetic process for forming various illustrations of the frequency spectrums of the input signal to be shown by the display 88. Further, under the control of the display processor 86, the frequency spectrums are displayed on the display 88 with respect to frequencies in a horizontal direction versus power levels in a vertical direction.

The foregoing is an operation of the spectrum analyzer 10 using the internal frequency converter 50. In the following, it is explained an operation of the spectrum analysis using the external mixer 72 to convert an input signal whose frequency is higher than the maximum frequency, 26GHz in the above case of the frequency converter 50, to be provided to the input terminal 100. The external mixer 72 is provided with the input signal to be analyzed and the first local signal from the first local oscillator 56 whose harmonic frequency is to be used.

An intermediate signal output of the external mixer 72 is connected to the switch 74 which is switched to receive the intermediate signal from the external mixer 72. The intermediate signal in this arrangement is the second intermediate frequency signal $f_{if2}$. A frequency of N-order harmonics of the first local signal is mixed with the input signal so that the second intermediate frequency signal fif2 is provided to the second intermediate frequency filter 66 through the switch 74. The above settings of the harmonic number N and the switch 74 is done by a user prior to the spectrum analysis.

Figure 4:
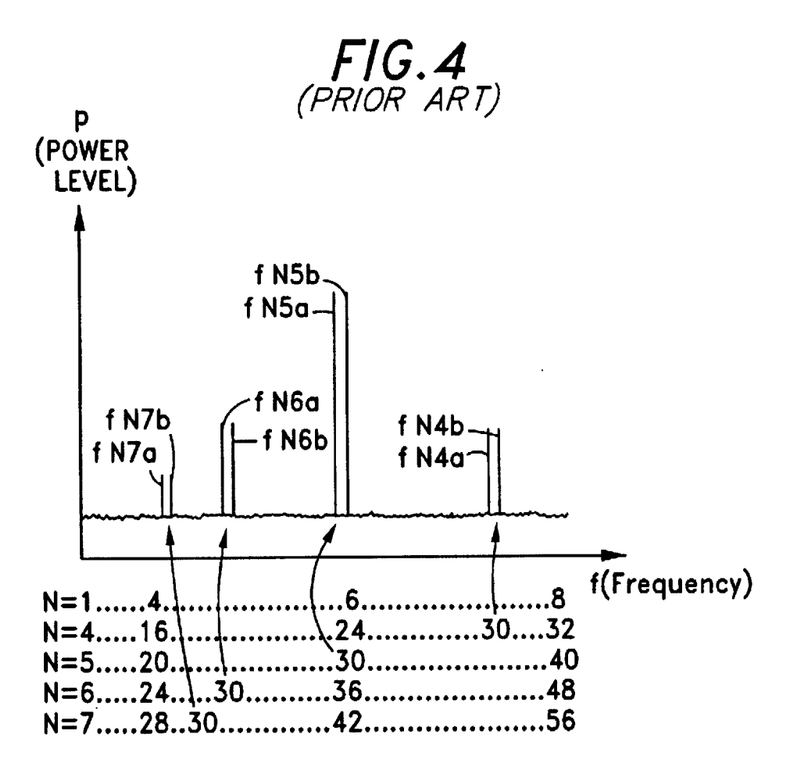
FIG. 4 is an illustration showing a spectrum display in the spectrum analyzer of FIG. 3 when using an external mixer.

Since the N-order harmonics of the first local signal $f_{osc}$ and the input signal $f_{hi}$ to be measured are mixed, two second intermediate frequency signals $f_{if2}=f_{hi}\pm(f_{osc}\times N)$ are generated for each order of the harmonics. These second intermediate frequency signals are rectified by the detector 68, converted to the digital signal by the AD converter 82 and displayed as spectrums. An example of displayed spectrums is shown in FIG. 4 in which an input frequency fhi that is to be analyzed is 30 GHz, the frequency range $f_{osc}$ of the first local oscillator 56 is 4 GHz–8 GHz, and the fifth harmonic number N=5 of the local oscillator is to be used in the external mixer 72. The horizontal direction indicates the frequency while the vertical direction indicates the power level of the spectrums.

As shown in FIG. 4, even though the input signal has only one frequency spectrum, which is 30 GHz, the display 88 shows many spectrums, most of which are image spectrums. Namely, the spectrums displayed in FIG. 4 are, spectrums $f_{N4a}$ and $f_{N4b}$, which are based on the fourth harmonic number N=4 of the first local signal, spectrums $f_{N5a}$ and $f_{N5b}$, which are based on the fifth harmonic number N=5, spectrums $f_{N6a}$ and $f_{N6b}$, which are based on the sixth harmonic number N=6, spectrums $f_{N7a}$ and $f_{N7b}$, which are based on the seventh harmonic number N=7. In this illustration, either one of the spectrums $f_{N5a}$ or $f_{N5b}$ is an intended spectrum (input signal has a single spectrum); which may be determined by the relationship in frequency between the frequency sweep in the first local oscillator 56 and the display 88. However, as in FIG. 4, many other spectrums are also displayed since the spectrum analyzer 10 is not able to distinguish the specific harmonic number and associated image signals when using the external mixer 72.

In the example of FIGS. 3 and 4, since the second intermediate frequency 421 MHz is produced by the difference between the input signal and the harmonics of the first local signal, two similar spectrums which are close together (image frequency) are displayed for each harmonic of the first local frequency. For example, with respect to the harmonics number N=5, the second intermediate frequency 421 MHz is created when the local frequency multiplied by five is 29.579 GHz (which is the spectrum $f_{N5a}$ in FIG. 4) and 30.421 GHz (which is the spectrum $f_{N5b}$ in FIG. 4). Either one of the two spectrums may be used as a true spectrum of the input signal while the other spectrum is considered an image spectrum. As shown in FIG. 4, many other spectrums are also produced in a similar manner for the other harmonic numbers N=4, 6 and 7 of the first local frequency as described above. Since the frequency spectrum of the input signal is intended to be analyzed by the 5th harmonic of the first local signal, these spectrums produced by other harmonics are also considered to be image spectrums within the context of the present invention.

As noted above, many frequency spectrums are displayed even for the input signal having only a single frequency spectrum, which makes the spectrum analysis by the conventional spectrum analyzer complicated and time consuming. Further, for measuring an input signal having a plurality of spectrums, a large number of image spectrums will be displayed on the display screen, which makes the spectrum analysis further complicated and difficult to determine the true frequency spectrums.

In contrast, for an input signal applied to the input terminal 100 which is mixed with the first local frequency signal by the first mixer 54 provided within the frequency converter 50, image spectrums will be eliminated because the frequency converter 50 includes the YTF 52 which is disposed before the first mixer 54, the pass band of which is controlled to change in the same way with the first local oscillator frequency. Such a tuned filter is not available for the measurement of the higher frequency spectrums by using the external mixer 72 in the above example.

Therefore, there is a need to develop a new frequency spectrum analyzer for identifying the true frequency spectrum in the input signal and the image spectrums produced by the spectrum analyzer and eliminating the image spectrums.

SUMMARY OF THE INVENTION

Therefore, it is an object of the present invention to provide a frequency spectrum analyzer which is capable of accurately measuring frequency spectrums without being affected by image spectrums.

It is a further object of the present invention to provide a frequency spectrum analyzer which is capable of effectively eliminating the image spectrums when using a frequency mixer.

It is a further object of the present invention to provide a frequency spectrum analyzer which is capable of easily identifying true frequency spectrums in an input signal.

It is a further object of the present invention to provide a frequency spectrum analyzer which is capable of measuring the frequency spectrums of an input signal with high reliability and ease of operation.

To accomplish these objectives, a frequency spectrum analyzer of the present invention includes a display for showing frequency spectrums in a power level versus frequency domain form, a local oscillator which is driven by a sweep signal to repeatedly cause a frequency sweep of a local signal wherein the local oscillator and the display operate in synchronism with the sweep signal, an intermediate frequency filter which is a band pass filter of variable bandwidth and its center frequency is an intermediate frequency for transmitting intermediate frequency signals, a frequency mixer for mixing an input signal to be measured and the local signal and generating the intermediate frequency signals whose frequency is a difference of the input signal and fundamental and harmonic components of the local signal wherein the intermediate frequency signal is supplied to the intermediate frequency filter, a detector for rectifying the intermediate frequency signal from the intermediate frequency filter wherein an output of the detector shows frequency spectrums of a true frequency spectrum of the input signal and image spectrums produced by the mixer, a sweep offset control for alternately causing a frequency shift in the frequency sweep in the local signal wherein the frequency shift is equal to $f_{if2} \times 2/N$, where $f_{if2}$ is the intermediate frequency and N is a harmonic number of the local signal, and an image removal processor for monitoring an output signal of the detector and identifying the true frequency spectrum of the input signal and the image spectrums on the basis of positional changes between the frequency sweep without the frequency shift and the frequency sweep including the frequency shift in the local signal.

According to the present invention, a local signal alternately causing a first sweep frequency $f_{osc1}$ which has no frequency shift and a second sweep frequency $f_{osc2}$ which is provided with the frequency shift is provided to the mixer to frequency mix with the input signal. The mixer produces the intermediate frequency signal $f_{if2}$ which will be detected and displayed as a frequency spectrum. The second sweep frequency has a frequency shift of ($f_{if2} \times 2/N$) where N is a harmonic number of the first local signal. In this arrangement, since output of the mixer is frequency shifted by two times of the intermediate frequency, the displayed spectrums in the first and second sweeps are unchanged for the true input spectrum while the image spectrums will change between the first and second sweeps. Thus, the image removal processor determines that the unchanged spectrum is a true input spectrum and eliminate the image spectrums so that only the true spectrum will be displayed on the display.

Therefore, the frequency spectrum analyzer of the present invention realizes accurate analysis of high frequency spectrums without being affected by image spectrums. Since the frequency spectrum analyzer can effectively eliminate the image spectrums when using a frequency mixer, it becomes easy and reliable to measure frequency spectrums of the input signal.

DETAILED DESCRIPTION OF THE PREFERRED EMBODIMENT

Figure 1:
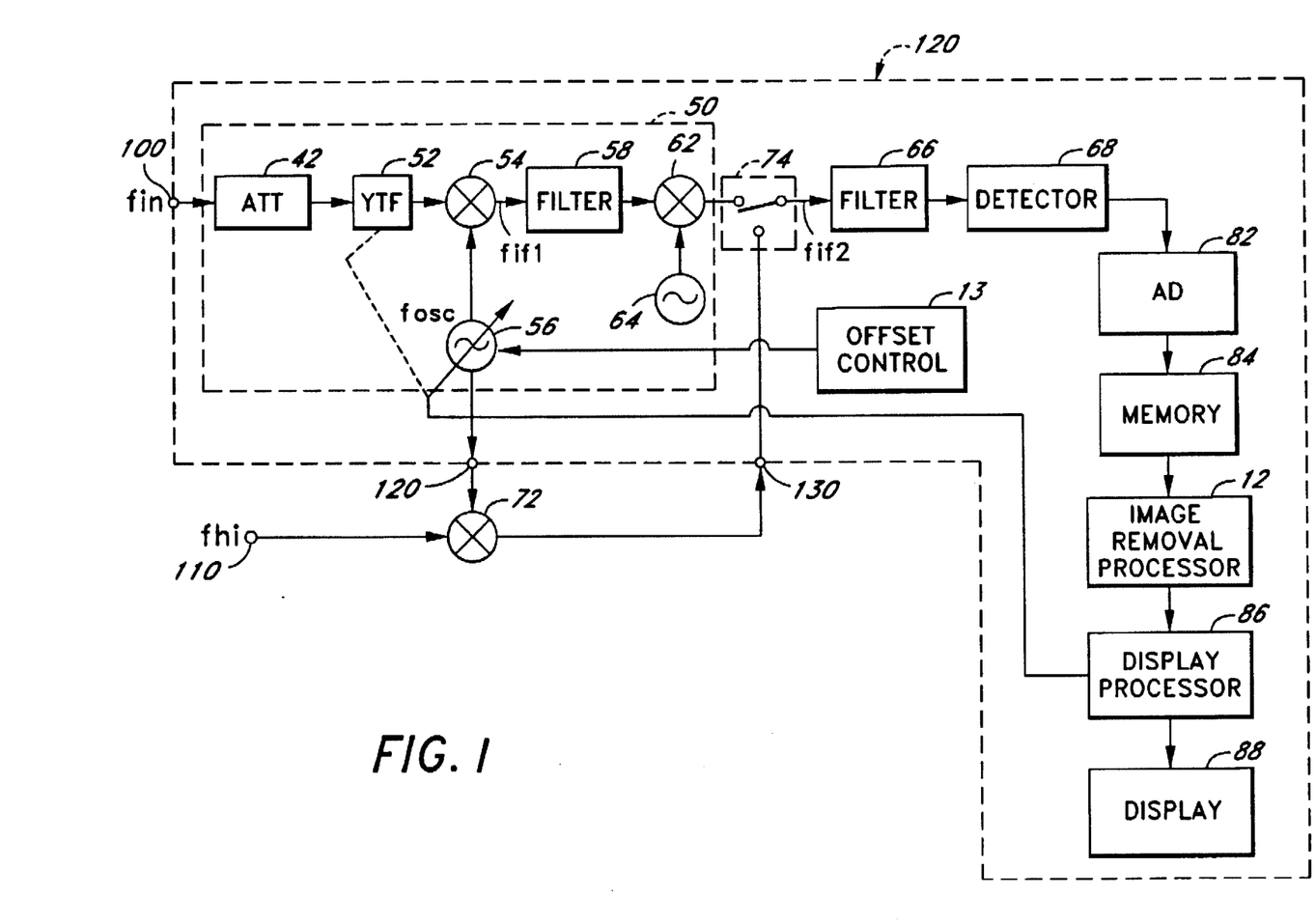
FIG. 1 is a block diagram showing a configuration of a first embodiment of a spectrum analyzer according to the present invention which is capable of eliminating image spectrums when using an external mixer.

FIG. 1 shows a first embodiment of the present invention. The present invention used in the embodiment is to display a true frequency spectrum by identifying a frequency spectrum of an input signal and image spectrums caused within the spectrum analyzer and eliminating the image spectrums when measuring a frequency spectrum of a high frequency input signal $f_{hi}$ by using an external mixer which mixes the input signal $f_{hi}$ and local signal frequencies which are multiples of a first local signal $f_{osc}$ to produce an intermediate frequency signal $f_{if2}$.

A structure of a frequency spectrum analyzer 110 shown in FIG. 1 is added with a sweep offset control 13 and an image removal processor 12 to the conventional spectrum analyzer of FIG. 3. Namely, a spectrum analyzer 110 has a frequency converter 50, a second intermediate frequency filter 66, a switch 74, a detector 68, an AD convertor 82, an AD buffer memory 84, display processor 86 and a display 88. As shown in FIG. 3, the image removal processor 12 is provided between the AD buffer memory 84 and the display control 86. The frequency converter 50 includes an attenuator 42, an YIG tuned filter (YTF) 52, a first mixer 54, a first local oscillator 56 which is a sweep oscillator, a first intermediate frequency filter 58, a second mixer 62 and a second local oscillator 64. An output of the sweep offset control 13 is connected to the first local oscillator 56 to alternately shift its frequency when using an external mixer 72. As in the example of FIG. 3, the local oscillator 56 and the YTF 52 are preferably YIG (yttrium-iron-garnet) tuned devices.

In operation, as a first step, image spectrums other than one of the spectrums produced by mixing the N-th harmonics of the first local frequency and the input signal are identified. Then, the process follows for eliminating the image spectrums identified in the first step. Here, as in the conventional example as noted above, it is assumed that the second intermediate frequency $f_{if2}$ is 421 MHz, the input signal frequency $f_{hi}$ has a single spectrum of 30 GHz, and the first local oscillator 56 sweeps from 4 GHz to 8 GHz based on a sweep signal such as a saw tooth signal, wherein the harmonics number N=5 of the first local frequency is intended to be used. The sweep signal is supplied, for example, from the display processor 86 which also controls the display 88 in synchronism with the first local oscillator 56. The harmonic frequencies of the first local signal from the oscillator 56 are mixed with the input signal at the external mixer 72.

Two second intermediate frequency signals $f_{if2}$ are produced for each harmonic number N since the second intermediate frequency signal $f_{if2}$ can be formed by the relationship of: $f_{if2}$=421 MHz=$f_{hi}$−($f_{osc}$×N) or $f_{if2}$=421 MHz=($f_{osc}$×N)−$f_{hi}$. Thus, for each harmonic number N of the local frequency, two image spectrums are formed which apart by 842 MHz one another, i.e., a frequency which is two times the second intermediate frequency $f_{if2}$=421 MHz.

Under this relationship, if the first local oscillator 56 sweeps such that the harmonic frequency is shifted by 842 MHz in the next sweep, one of the second intermediate frequency spectrums will be produced in the same position as one of the previous second intermediate frequency spectrums. Namely, for a frequency spectrum of the input signal there will be one spectrum detected which is not changed between the sweep without the frequency shift and the sweep involving the frequency shift if the frequency shift is two times the second intermediate frequency. This feature is used to identify the true spectrum in the present invention.

Namely, in the present invention, the frequency sweep in the first local oscillator 56 is controlled so that the frequency is alternately changed in a first sweep frequency $f_{osc1}$ of 4 GHz–8 GHz without the frequency shift and a second sweep frequency $f_{osc2}$ which is frequency shifted by 842 MHz/N (second intermediate frequency $f_{if2}$×2/N) from the first sweep frequency $f_{osc1}$. In this situation, the true frequency spectrum can be determined by using the spectrum displayed in the same position of the display both in the first and second sweep frequencies of the first local oscillator 56, i.e., the spectrum which is unchanged between the sweeps.

For example, as in the previous situation for measuring the single frequency spectrum of 30 GHz, with respect to the harmonics number N=5, the second intermediate frequency 421 MHz is created when the local frequency multiplied by five (N=5) is 29.579 GHz and 30.421 GHz in the first sweep frequency $f_{osc1}$ which is in the range of 4–8 GHz. The second intermediate frequency signals are expressed as frequency spectrums $f_{N5a}$ and $f_{N5b}$ in FIG. 2(a). Either one of the two spectrums may be used as a true spectrum of the input signal while the other spectrum is considered an image spectrum, which may be determined by, for example, the relationship between the frequency sweep of the local oscillator 56 and the frequency setting in the display 88. In this example, it is assumed that the spectrum $f_{N5b}$ is the true frequency spectrum of the input signal.

Then, in the second sweep frequency $f_{osc2}$, the frequency of the first local oscillator 56 is shifted under the control of the sweep offset control 13 so that the first local oscillator 56 sweeps from (4 GHz−421 MHz×⅖) to (8 GHz−421 MHz× ⅖). This means that the frequency of the first local oscillator 56 is shifted by "421 MHz×⅖" from the previous sweep. In this situation, the second intermediate frequency 421 MHz is also created when the local frequency multiplied by five (N=5) is 29.579 GHz and 30.421 GHz as in the first sweep frequency. However, since the first local oscillator 56 is frequency shifted by "421 MHz×⅖", the displayed spectrums for the harmonic number N=5 is frequency shifted by 842 MHz from the first sweep and expressed as frequency spectrums $f_{N5c}$ and $f_{N5d}$ as in FIG. 2(a). As shown in the bold line of FIG. 2(a), in this example, the frequency spectrum $f_{N5b}$ in the first sweep range and the frequency spectrum $f_{N5c}$ in the second sweep range are superimposed, i.e., both spectrums come in the same frequency position.

Therefore, the spectrum analyzer of the present invention can determine that the superimposed frequency spectrum is the true spectrum of the input signal as described below. The sweep offset controller 13 controls the first local oscillator 56 so that the frequency shift by "421 MHz×⅔" is alternately provided to the first local oscillator 56. Thus, the first local oscillator 56 sweeps its frequency without the frequency shift (the first sweep frequency range $f_{osc1}$) and with the frequency shift (the second sweep frequency range $f_{osc2}$) alternately.

Figure 2A:
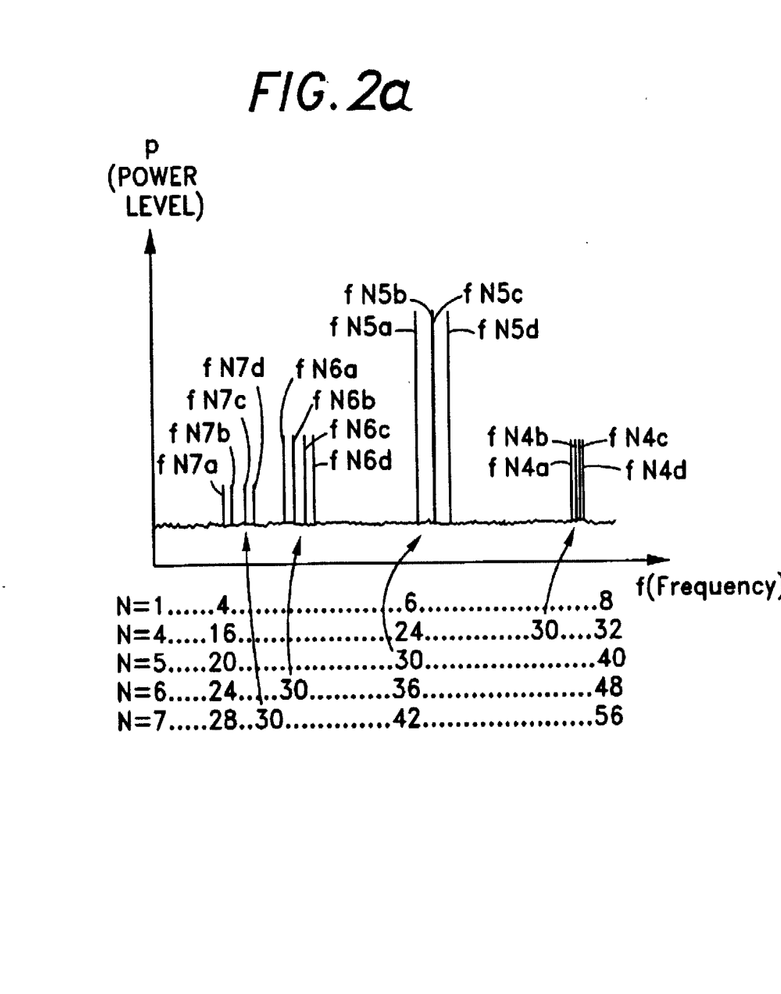
FIG. 2(a) is an illustration showing a spectrum display before eliminating image spectrums.

As shown in FIG. 2(a), by the first frequency sweep, the spectrums $f_{N4a}$ and $f_{4Nb}$ for the fourth harmonic number N=4, the spectrums $f_{N5a}$ and $f_{5Nb}$ for the fifth harmonic number N=5, the spectrums $f_{N6a}$ and $f_{N6b}$ for the sixth harmonic number N=6, and the spectrums $f_{N7a}$ and $f_{N7b}$ are respectively produced. By the second frequency sweep, the spectrums $f_{N4c}$ and $f_{N4d}$ for the fourth harmonic number N=4, the spectrums $f_{N5c}$ and $f_{N5d}$ for the fifth harmonic number N=5, the spectrums $f_{N6c}$ and $f_{N6d}$ for the sixth harmonic number N=6, and the spectrums $f_{N7c}$ and $f_{N7d}$ for the seventh harmonic number N=7 are respectively produced.

Figure 2B:
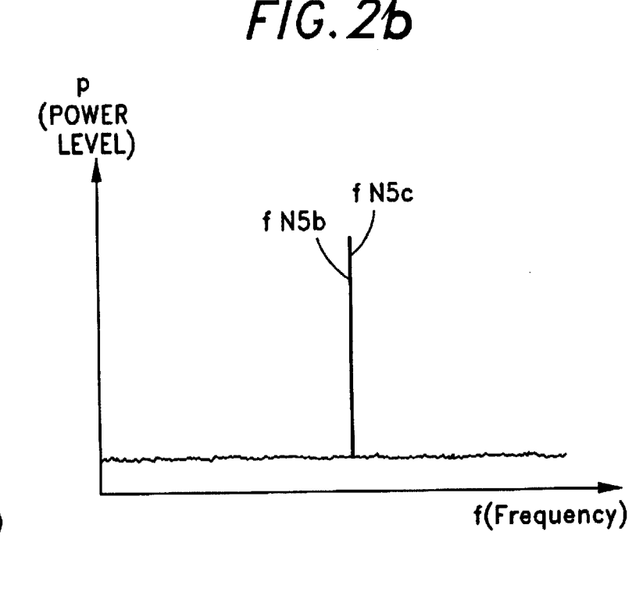
FIG. 2(b) is an illustration showing a spectrum display after eliminating image spectrums in accordance with the present invention.

As noted above, only the spectrums $f_{N5b}$ and $f_{N5c}$ are unchanged and come in the same position in either sweep frequency. All the other spectrums are repeatedly appear or disappear depending on the sweep frequency ranges. Therefore, the image removal processor 12 determines that the frequency spectrum produced in the same position in both the first and second frequency sweeps is a true frequency spectrum of the input signal and all the others are image spectrums. The image removal processor 12 then prevents the image spectrums from being displayed by sending the instruction to the display processor 86. As a result, a single spectrum for the input signal 30 GHz is displayed as shown in FIG. 2(b).

In the above example, although the second sweep frequency $f_{osc2}$ is frequency shifted to be lower than the first sweep frequency $f_{osc1}$ by 842 MHz/N (second intermediate frequency $f_{if2}$×2/N), it is also possible to set the offset frequency such that the second sweep frequency $f_{osc2}$ is frequency shifted to be higher than the first sweep frequency $f_{osc1}$ by 842 MHz/N (second intermediate frequency $f_{if2}$×2/N). Thus, the general expression of the frequency shift in the present invention is; $f_{osc2}=f_{osc1}\pm(f_{if2}\times2/N)$ where N is a harmonic number of the local signal frequency to be used in the mixer.

Figure 5:
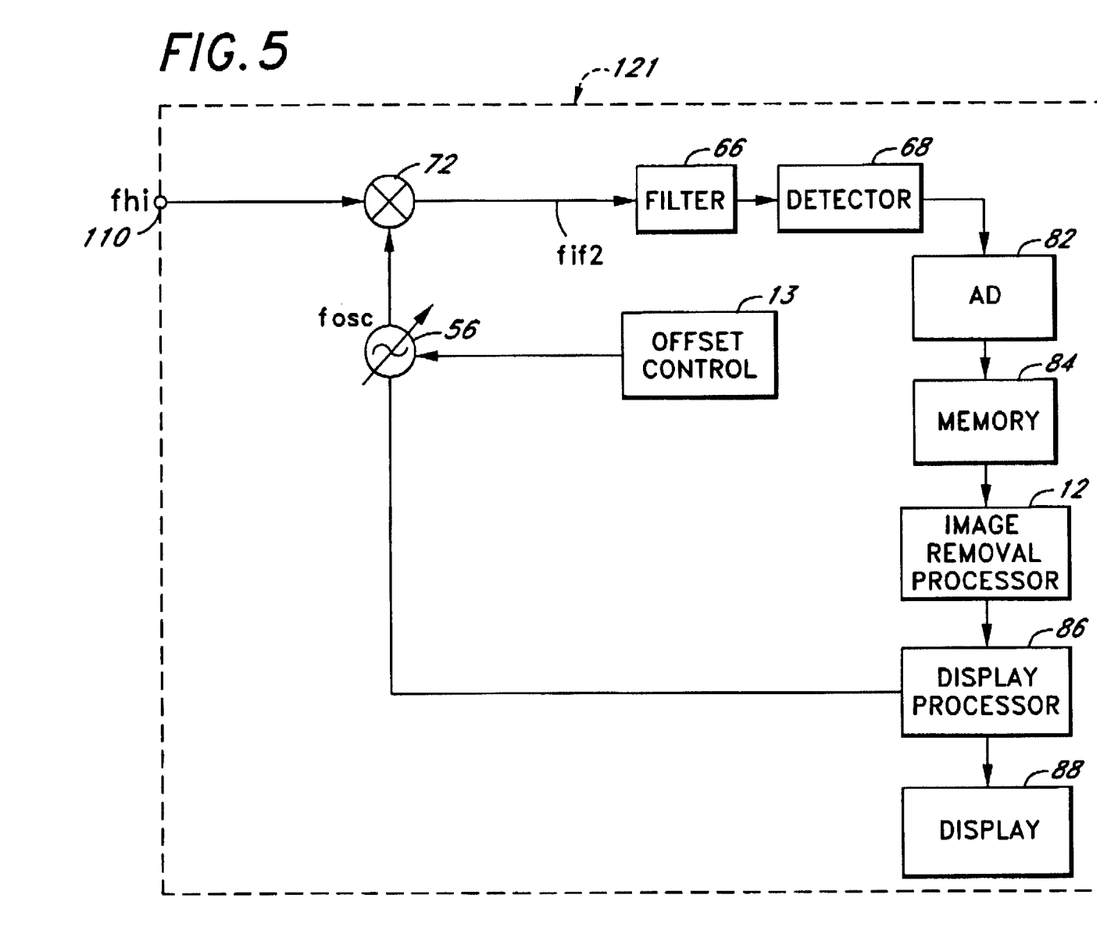
FIG. 5 is a block diagram showing a configuration of a second embodiment of the present invention which is capable of eliminating image spectrums when using an internal mixer.

FIG. 5 shows a second embodiment of a spectrum analyzer 121 of the present invention. In the embodiment of FIG. 1, although the mixer 72 is used as an external mixer for analyzing an input signal which has a higher frequency than the frequency converter 50, in the embodiment of FIG. 5, a mixer 72 is employed within the spectrum analyzer 121 to be used for both low and high frequency input signals. Thus, in this embodiment, the mixer 72 is used not only as a harmonic mixer but also as a fundamental frequency mixer. The mixer 72 receives an input signal and a first local signal and directly provides an intermediate frequency signal to a second intermediate frequency filter 66.

Similar to the first embodiment, the sweep offset control 13 alternately provides the offset signal to the first local oscillator 56 to shift its frequency. If the input signal is low in frequency and requires the fundamental frequency of the first local signal to produce the intermediate frequency signal by the mixer 72, the harmonic number is set to N=1 in the foregoing explanation. Thus, the first local oscillator 56 alternately sweeps the first frequency range $f_{osc1}$ without the frequency shift (for example 4 GHz-8 GHz) and the second frequency range $f_{osc2}$ which is frequency shifted by 842 MHz. An input frequency spectrum is unchanged between the first and second sweeps while the image spectrums will change between the sweeps as noted above. Thus, it is possible to distinguish the true spectrum and unwanted image spectrums and remove the image spectrums. If the input signal is high in frequency and requires a harmonic of the first local signal, the image spectrums can be removed as described with reference to FIGS. 1 and 2.

As has been foregoing, according to the present invention, the first sweep frequency $f_{osc1}$ and the second sweep frequency $f_{osc2}$ are alternately provided to the mixer to frequency mix with the input signal. The mixer produces the intermediate frequency signal $f_{if2}$ which will be detected and displayed as a frequency spectrum. The second sweep frequency has a frequency offset of ($f_{if2}\times2/N$) where N is a harmonic number of the first local signal. In this arrangement, since output of the mixer is frequency shifted by two times of the intermediate frequency, the displayed spectrums in the first and second sweeps are unchanged for the true input spectrum while the image spectrums will change between the first and second sweeps. Thus, the image removal processor 12 determines that the unchanged spectrum is a true input spectrum and eliminate the image spectrums so that only the true spectrum will be displayed on the display 88.

Therefore, the frequency spectrum analyzer of the present invention realizes accurate analysis of high frequency spectrums without being affected by image spectrums. Since the frequency spectrum analyzer can effectively eliminate the image spectrums when using a frequency mixer, it becomes easy and reliable to measure frequency spectrums of the input signal.

What is claimed is:

1. A frequency spectrum analyzer for measuring frequency spectrums in an input signal, comprising:

a display for showing frequency spectrums in a power level versus frequency domain form;

a local oscillator which is driven by a sweep signal to repeatedly cause a frequency sweep of a local signal, said local oscillator and said display operate in synchronism with said sweep signal;

an intermediate frequency filter whose center frequency is an intermediate frequency for transmitting intermediate frequency signals;

a frequency mixer for mixing an input signal to be measured and said local signal and generating said intermediate frequency signals whose frequency is a difference of said input signal and fundamental and harmonic components of said local signal, said intermediate frequency signal being supplied to said intermediate frequency filter;

a detector for rectifying said intermediate frequency signal from said intermediate frequency filter, an output of said detector showing frequency spectrums of a true frequency spectrum of said input signal and image spectrums produced by said frequency mixer;

a sweep offset control for alternately causing a first sweep having no frequency shift and a second sweep having a frequency shift in said frequency sweep in said local signal, said frequency shift being equal to $f_{if2}\times2/N$, where $f_{if2}$ is said intermediate frequency and N is a harmonic number of said local signal to be used in said frequency mixer; and an image removal processor for monitoring an output signal of said detector and identifying said true frequency spectrum of said input signal and said image spectrums on the basis of positional changes between said first sweep without said frequency shift and said second sweep including said frequency shift in said local signal;

wherein only said true frequency spectrum is superimposed on the same position of said frequency domain between said first and second sweeps.

2. A frequency spectrum analyzer as defined in claim 1, wherein said frequency shift decreases a frequency of said local signal by said $f_{if2} \times 2/N$.

3. A frequency spectrum analyzer as defined in claim 1, wherein said frequency shift increases a frequency of said local signal by said $f_{if2} \times 2/N$.

4. A frequency spectrum analyzer as defined in claim 1 further includes:

an external mixer which mixes said input signal with harmonics of said local signal to produce said intermediate frequency signal; and a switch for selectively receiving said intermediate frequency signal from said frequency mixer or said external mixer.

5. A frequency spectrum analyzer as defined in claim 1, wherein said intermediate frequency filter is a band pass filter of variable bandwidth and said center frequency determines said intermediate frequency of said intermediate frequency signals from said frequency mixer.

6. A frequency spectrum analyzer as defined in claim 1 further includes a display processor which provides said sweep signal to said local oscillator such that said display and said local oscillator interact to show said frequency spectrums on said display.

7. A frequency spectrum analyzer as defined in claim 1 further includes:

an AD converter for converting said output of said detector to digital data; and a buffer memory for storing said digital data from said AD converter and providing said digital data to said image removal processor.

8. A frequency spectrum analyzer as defined in claim 1 further includes:

an input attenuator for reducing a power level of said input signal; and a tuning filter which is driven by said sweep signal in synchronism with said local oscillator such that a tuning frequency of said tuning filter is a sum of a frequency of said local oscillator and said intermediate frequency.

9. A frequency spectrum analyzer as defined in claim 1, wherein said local oscillator is a YIG (yttrium-iron-garnet) tuned oscillator which linearly changes its frequency in proportion to a magnetic intensity produced by said sweep signal.

10. A frequency spectrum analyzer as defined in claim 8, wherein said tuning filter is a YIG (yttrium-iron-garnet) tuned filter which linearly changes its resonant frequency in proportion to a magnetic intensity produced by said sweep signal.

* * * * *